United States Patent
Huang (10) Patent No.: US 6,285,578 B1
(45) Date of Patent: Sep. 4, 2001

(54) HIDDEN REFRESH PSEUDO SRAM AND HIDDEN REFRESH METHOD

(75) Inventor: Hong-Yi Huang, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 0 days.

(21) Appl. No.: 09/477,906

(22) Filed: Jan. 5, 2000

(30) Foreign Application Priority Data

Oct. 6, 1999 (TW) ................................................ 088117196

(51) Int. Cl.$^7$ ........................................................ G11C 11/00
(52) U.S. Cl. ............................ 365/154; 365/156; 365/222
(58) Field of Search ............................. 365/154, 156, 365/222

(56) References Cited

U.S. PATENT DOCUMENTS

| | | | |
|---|---|---|---|
| 5,706,226 | * | 1/1998 | Chan et al. .......................... 365/156 |
| 6,044,011 | * | 3/2000 | Marr et al. .......................... 365/154 |
| 6,111,780 | * | 8/2000 | Bertin .................................. 365/154 |
| 6,128,215 | * | 10/2000 | Lee ...................................... 365/154 |

\* cited by examiner

Primary Examiner—David Nelms
Assistant Examiner—Gene N. Auduong
(74) Attorney, Agent, or Firm—Darby & Darby (57) ABSTRACT

A hidden refresh 2P2N pseudo SRAM having an array of memory cells. Each of the memory cells includes a cross-couple latch and two PMOS access transistors. The cross-couple latch are structured with two NMOS transistors which are cross coupled to each other and provided to store a pair of signals. The two NMOS transistors have their sources connected to a negative source voltage, and their drains and gates cross coupled to each other. The two PMOS transistors are controlled by a word line and provided to respectively access the two NMOS transistors of the cross-couple latch and a pair of bit lines. The two PMOS transistors have their sources connected to the pair of bit lines and drains connected to the drains of the two NMOS transistors, respectively.

20 Claims, 8 Drawing Sheets

HIDDEN REFRESH PSEUDO SRAM AND HIDDEN REFRESH METHOD

BACKGROUND OF THE INVENTION

1. Field of the Invention

The present invention relates to computer memory, and in particular, to a hidden refresh 2P2N pseudo SRAM (static random access memory) and its hidden refresh method.

2. Description of the Related Art

Memory plays an indispensable role in computer industries. Usually, a memory is classified into a DRAM (dynamic random access memory) and a SRAM (static random access memory) according it's respective data storage capability. DRAM is advantageous for its small size, but requires periodic refresh to prevent data loss due to current leakage. SRAM is advantageous for its simple operations, but occupies a large chip area.

Figure 1A:
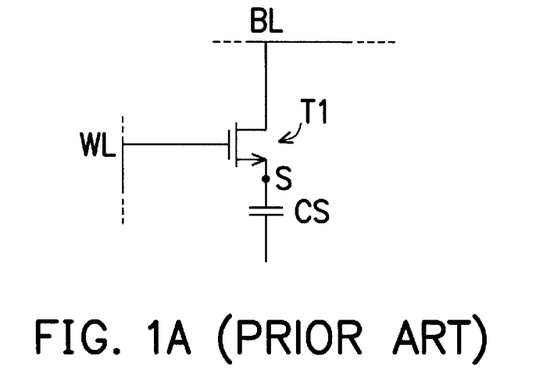
FIG. 1A (Prior Art) is a circuit diagram showing a conventional 1T1C memory cell of a DRAM.
Figure 1B:
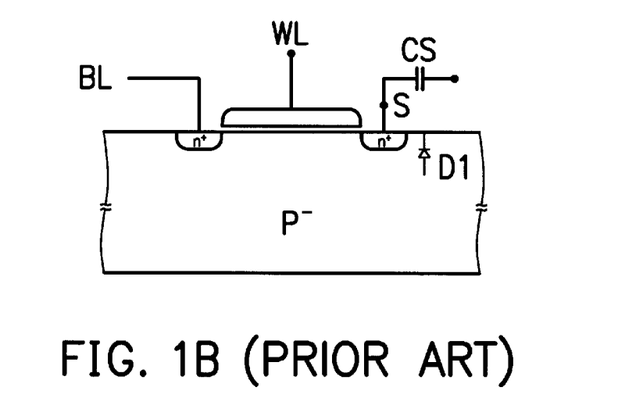
FIG. 1B (Prior Art) is a sectional diagram showing the 1T1C memory cell in FIG. 1A formed on a semiconductor substrate.

FIG. 1A (Prior Art) is a circuit diagram showing a conventional 1T1C memory cell of a DRAM. As shown in FIG. 1A, the 1T1C memory cell, known in the art, includes an access transistor T1 and a storage capacitor CS. The access transistor T1 has a source connected to the storage capacitor CS, a gate connected to a word line WL, and a drain connected to a bit line BL. FIG. 1B (Prior Art) is a diagram showing the 1T1C memory cell in FIG. 1A formed on a semiconductor substrate. As shown in FIG. 1B, a parasitic diode D1 (PN junction) is formed between the source of the access transistor T1 and the storage capacitor CS. Therefore, a logic "1" signal stored at the storage capacitor CS gradually decays even when the access transistor T1 is shut off, where the word line WL is "0". To prevent data loss, periodic refresh is performed for the DRAM, which reads the logic "1" signal stored at the storage capacitor CS, amplifies the logic "1" signal by a sense amplifier (not shown) connected to the bit line BL, and writes back the amplified signal.

Figure 2:
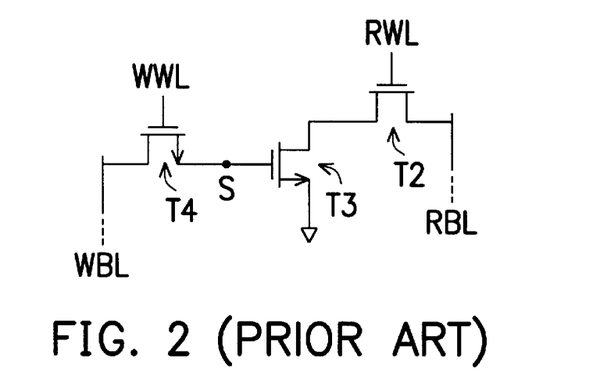
FIG. 2 (Prior Art) is a circuit diagram showing a conventional 3T memory cell of a DRAM.

FIG. 2 (Prior Art) is a circuit diagram showing a conventional 3T memory cell of a DRAM As shown in FIG. 2, the 3T memory cell, known in the art, includes a read transistor T2, a storage transistor T3, and a write transistor T4. The read transistor T2 has a gate connected to a read word line RWL, a drain connected to a read bit line RBL, and a source. The storage capacitor T3 has a gate, a drain connected to the source of the source of the read transistor T2, and a source connected to a negative source voltage of the DRAM. The write transistor T4 has a gate connected to a write word line WWL, a drain connected to the word bit line WBL, and a source connected to the gate of the storage transistor T3. As in the 1T1C memory cell in FIGS. 1A and 1B, a logic "1" signal stored at the storage transistor T3 decays due to a leakage current. To prevent data loss, periodic refresh is performed for the DRAM, which reads the logic "1" signal stored at the storage transistor T3 through the read word line RWL, amplifies the logic "1" signal by a sense amplifier (not shown) connected to the bit line BL, and writes back the amplified signal through the write word line WWL.

Figure 3:
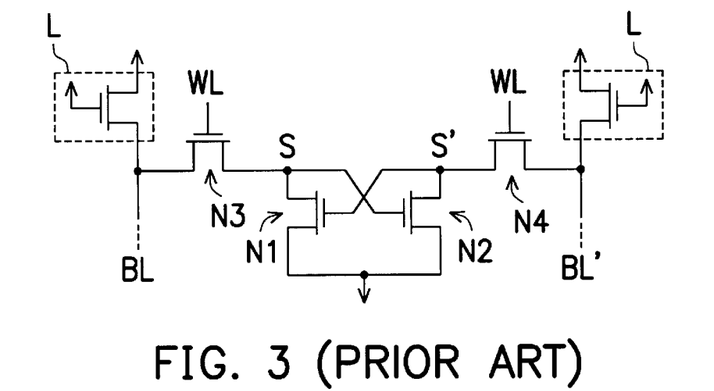
FIG. 3 (Prior Art) is a circuit diagram showing a conventional 4T memory cell of a DRAM.

FIG. 3 (Prior Art) is a circuit diagram showing a conventional 4T memory cell of a DRAM. As shown in FIG. 3, the 4T memory cell, known in the art, includes four NMOS transistors N1, N2, N3 and N4. The NMOS transistors N1 and N2 have their sources connected to a negative source voltage, and gates and sources cross coupled to each other to form a cross-couple latch storing a pair of signals S/S'. The NMOS transistors N3 and N4 have their gates connected to the word line WL, and drains and sources connected to a pair of bit lines BL/BL' and the drains of the NMOS transistors N1 and N2, respectively, to access the pair of signals S/S' stored at the cross-couple latch. The storage data swing of the pair of signals S/S' is a positive source voltage of the DRAM minus a threshold voltage (VDD−VTN) of the NMOS transistors N1, N2, N3 and N4. When the NMOS transistors N3 and N4 are closed (i.e., the word line WL is "0") and the pair of signals S/S' at the cross-couple latch are "0"/"1"(VDD−VTN), the signal S is not floating, whereas the signal S' is floating. Therefore, as in the 1T1C memory cell in FIGS. 1A and 1B, periodic refresh is performed to prevent data loss at the signal S', which only opens the word line WL for a short time to ensure that load L connected to the pair of bit lines BL/BL' provides sufficient refresh currents. The load L can be controlled to function only when performing pre-charging and refresh operations of the DRAM, thereby reducing the power consumed.

Compared with the 1T1C memory cell which is manufactured using a stack process or a trench process, the 4T memory cell is manufactured using a standard CMOS process, known in the art. Further, the 4T memory cell stores data differentially (such as the pair of signals S/S') and has a larger noise margin and a higher access speed. Therefore, most pseudo RAMs are structured with 4T memory cells to be manufactured using a standard CMOS process.

Figure 4A:
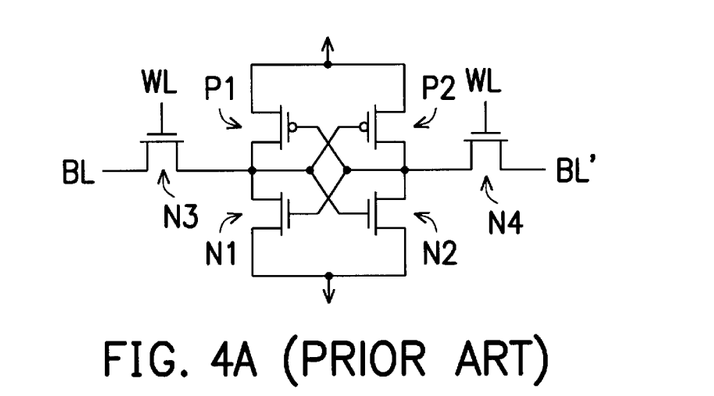
FIG. 4A (Prior Art) is a circuit diagrams showing a conventional 6T memory cell of a SRAM.
Figure 4B:
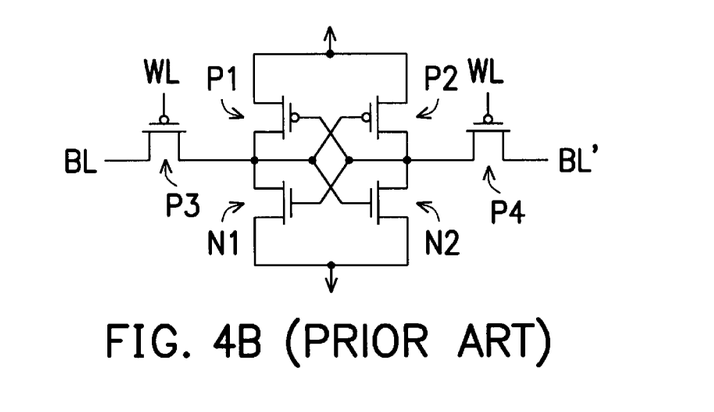
FIG. 4B (Prior Art) is a circuit diagrams showing another conventional 6T memory cell of a SRAM.

FIGS. 4A and 4B (Prior Art) are circuit diagrams showing a 6T memory cell of a SRAM, known in the art. To prevent floating of the differential signals S/S' in the 4T memory cell of FIG. 3, two PMOS transistors P1 and P2 are included in the 4T memory cell to obtain a SRAM cell which operates as the 4T memory cell, as shown in FIG. 4A. The PMOS transistors P1 and P2 have their sources connected to a positive source voltage of the SRAM, gates connected to the drains of the NMOS transistors N2 and N1, and drains connected to the drains of the NMOS transistors N1 and N2, respectively. Further, the access NMOS transistors N3 and N4 in FIG. 4A can also be replaced with two PMOS transistors P3 and P4, as shown in FIG. 4B. In this case, the PMOS transistors P1 and P2 constitute a cross-couple latch, and the NMOS transistors N1 and N2 are provided only to prevent floating of the differential signals S/S'.

Figure 4C:
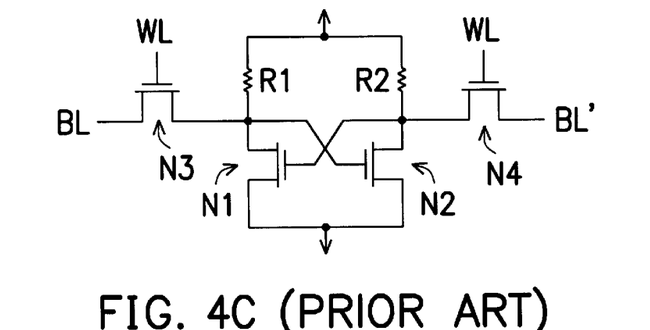
FIG. 4C (Prior Art) is a circuit diagram showing a conventional 4T memory cell with poly loads.
Figure 4D:
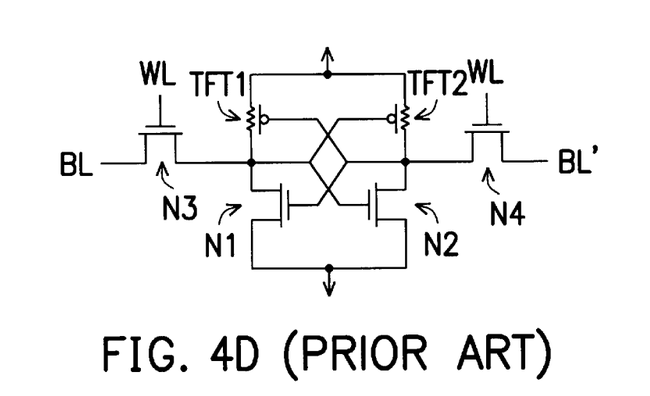
FIG. 4D (Prior Art) is a circuit diagram showing a conventional 6T memory cell with TFT loads.

Further, since the leakage current is mostly derived from reverse bias leakage of the parasitic diode, the PMOS transistors P1 and P2 can be also replaced with two resistors R1 and R2 ($10^{10}$~$10^{11}\Omega$), as shown in FIG. 4C (Prior Art), that provide a supply current which is larger than the leakage current and prevent data loss of the differential signals S/S'. In this case, the resistors R1 and R2 can be formed above the NMOS transistors and occupy the same chip area as the 4T memory cell. Further, the resistors R1 and R2 in FIG. 4C can be replaced with two thin film transistors TFT1 and TFT2 to obtain a larger noise margin and a lower standby current, as shown in FIG. 4D (Prior Art). In this case, the thin film transistors TFT1 and TFT2 can also be formed above the NMOS transistors and occupy the same chip area as the 4T memory cell.

From the above, a pseudo SRAM with 4T memory cells can be manufactured using a standard CMOS process, reducing chip area by two PMOS transistors, and operate as a standard SRAM. However, it is also necessary to include a refresh operation (that is, opening all word lines for a short time) except normal read/write operations, which result in power loss.

Figure 5A:
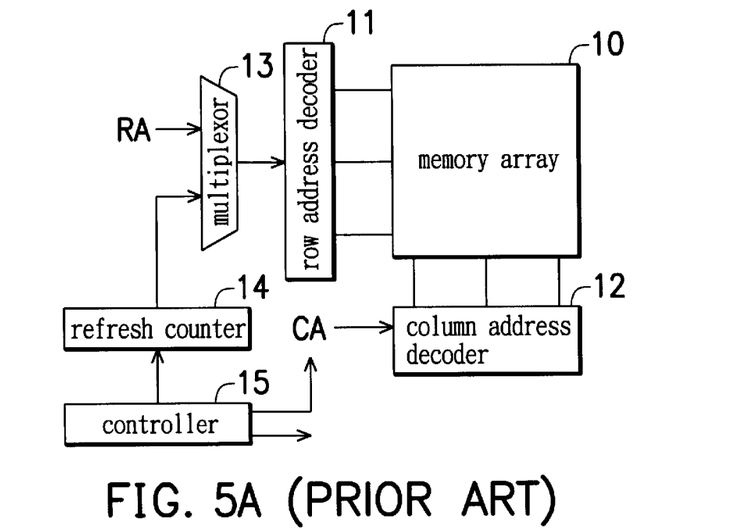
FIG. 5A (Prior Art) is a circuit diagram showing a conventional driving circuit of a pseudo SRAM.

FIG. 5A (Prior Art) is a circuit diagram showing a driver of a conventional pseudo SRAM. As shown in FIG. 5A, the driver of the memory array 10 includes a row address decoder 11, a column address decoder 12, a multiplexor 13, a refresh counter 14, and a controller 15. The multiplexor 13, under the control of the controller 15, selectively transfers a row address RA or a counting result of the refresh counter 14 to the row address decoder 11 to generate a driving signal of a corresponding word line of the memory array 10. The column address decoder 12 receives a column address CA to generate a driving signal of a corresponding bit line of the memory array 10. Therefore, access and refresh operations of the memory array 10 can be performed according to the driving signals generated by the row address decoder 11 and the column address decoder 12.

Figure 5B:
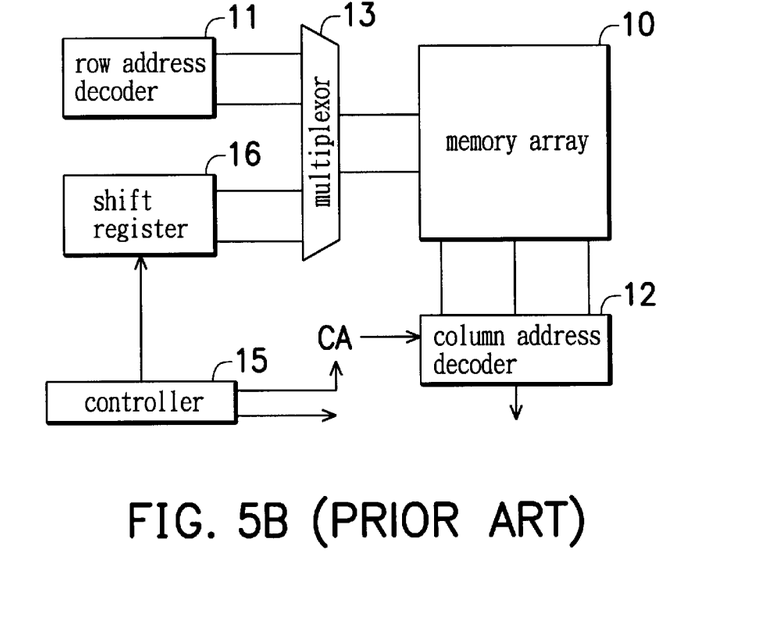
FIG. 5B (Prior Art) is a circuit diagram showing another conventional driving circuit of a pseudo SRAM.
Figure 5C:
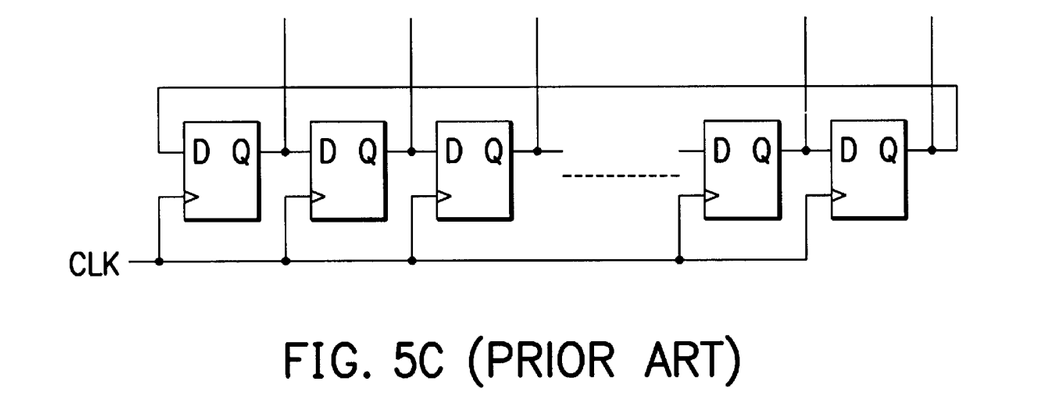
FIG. 5C (Prior Art) is a circuit diagram showing the shift register in FIG. 5B.

The refresh counter 14 in FIG. 5A can be replaced with a shift register 16, as shown in FIG. 5B (Prior Art). In this case, the shift register 16 sequentially outputs a pulse to serve as a driving signal of a corresponding word line of the memory array 10. Meanwhile, the row address decoder 11 also receives a row address RA to generate a driving signal of the corresponding word line. The multiplexor 13 then selectively transfers the driving signal of the row address decoder 11 or the shift register 16 to drive the corresponding word line. The column address decoder 12 receives a column address CA to generate a driving signal of a corresponding bit line of the memory array 10. Therefore, access and refresh operations of the memory array 10 can be performed according to the driving signals which are respectively selected by the multiplexor 13 and generated by the column address decoder 12. FIG. 5C (Prior Art) is a circuit diagram showing the shift register 16 in FIG. 5B. As shown in FIG. 5B, the shift register 16 is structured with D flip flops which are connected in a ring and controlled by a system clock CLK. When a pulse is input to the shift register 16, the pulse will propagate along the D flip flops at the rising edge or the falling edge of the system clock CLK. Therefore, if the number of the D flip flops is designed to be the same as the number of the word lines of the memory array 10, the output of the shift register 16 can be directly used as driving signals for the word lines of the memory array 10.

In the pseudo SRAM with 4T memory cells, when the access transistors N3 and N4 are closed (i.e., the word line WL is "0"), the transistor N1 (or N2) which stores a logic "1" signal can be refreshed not only by changing the voltage levels of the pair of bit lines BL/BL', but also by opening the word line WL. Further, when the access transistors N3 and N4 are open (i.e., the word line WL is "1"), a large read current will flow into the transistor N2 (or N1) which stores a logic "0" signal, thereby causing data confusion when simultaneously opening two or more word lines. Therefore, the pseudo SRAM must be refreshed by row which consumes extra power.

Accordingly, there is a general need in the art for an improved, optimized SRAM for use in a computer. In particular, there is a need to provide a hidden refresh 2P2N pseudo SRAM, which avoids data confusion when opening plural word lines at the same time and reduce power consumption.

SUMMARY OF THE INVENTION

The present invention provides a hidden refresh 2P2N pseudo SRAM for use in a computer having an array of memory cells. Each of the memory cells includes a cross-couple latch and two PMOS access transistors. The cross-couple latch includes two NMOS transistors cross coupled to each other. The two PMOS access transistors are controlled by a word line, and are provided to access the two NMOS transistors of the cross-couple latch and a pair of bit lines, respectively.

In the hidden refresh 2P2N pseudo SRAM according to the present invention, the two NMOS transistors of the cross-couple latch include a first NMOS transistor and a second NMOS transistor, wherein the first NMOS transistor has a gate, a drain, and a source connected to a negative source voltage, and the second transistor has a gate connected to the drain of the first NMOS transistor, a drain connected to the gate of the first NMOS transistor, and a source connected to the negative source voltage.

Further, in the hidden refresh 2P2N pseudo SRAM according to the present invention, the two PMOS access transistors include a first PMOS transistor and a second PMOS transistor, wherein the first PMOS transistor has a gate connected to the word line, a source connected to one of the pair of bit lines, and a drain connected to the drain of the first NMOS transistor, and the second PMOS transistor has a gate connected to the word line, a source connected to the other of the pair of bit lines, and a drain connected to the drain of the second NMOS transistor.

In addition, the present invention also provides a hidden refresh method for a hidden refresh 2P2N pseudo SRAM, as mentioned above. According to a preferred embodiment of the method of the present invention, the refresh operation is accomplished by driving the pair of bit lines to a voltage which is higher than a positive source voltage of the 2P2N pseudo SRAM, by a voltage difference when the word line is driven to the positive source voltage, so that the PMOS access transistors are slightly open to provide a small refresh current.

According to this embodiment of the hidden refresh method according to the present invention, the refresh operation for a pseudo SRAM is performed when a sensing amplifier connected to the pair of bit lines is operating, so that a read time of the pseudo SRAM is not increased. Further, the voltage difference is smaller than threshold voltages of the two PMOS access transistors. A time period is provided to ensure that a sufficient current is supplied to the cross couple latch to recover the logic "1" signal stored therein.

BRIEF DESCRIPTION OF THE DRAWINGS

These and other features, aspects, and advantages of the invention will become readily apparent with reference to the following detailed description of a presently preferred, but nonetheless illustrative embodiment when read in conjunction with the accompanying drawings, in which like reference designations represent like features throughout the enumerated Figures. The drawings referred to herein will be understood as not being drawn to scale except if specifically noted, the emphasis instead being placed upon illustrating the principles of the invention. In the accompanying drawings.

DETAILED DESCRIPTION OF THE PREFERRED EMBODIMENTS

Figure 6A:
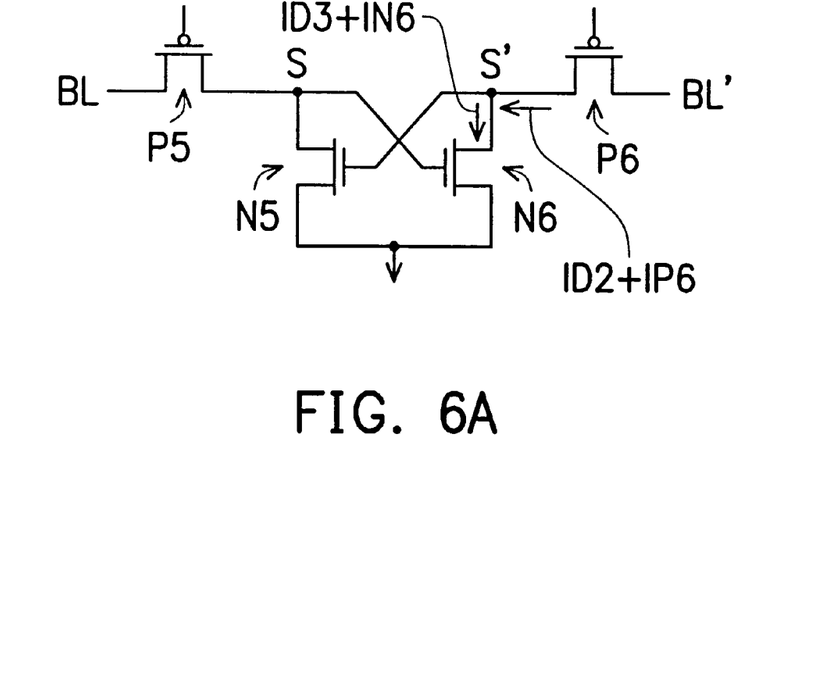
FIG. 6A is a circuit diagram showing a memory cell of a hidden refresh 2P2N pseudo SRAM according to the present invention.

FIG. 6A is a circuit diagram showing a memory cell of a hidden refresh 2P2N pseudo SRAM according to the present invention. As shown in FIG. 6A, the memory cell includes two NMOS transistors N5 and N6 and two PMOS transistors P5 and P6. The NMOS transistors N5 and N6 have their sources connected to a negative source voltage, and their drains and gates coupled to each other to form a cross-couple latch for storing data (a pair of signals S/S'). The PMOS transistors P5 and P6 have their gates both connected to a word line WL, and their sources and drains respectively connected to a pair of bit lines BL/BL' and the drains of the NMOS transistors N1 and N2 in the cross couple latch to access the pair of signals S/S'.

The reverse bias current I(LEAKAGE) of a diode and the subthreshold current I(SUB) of a transistor (such as the transistors used in the invention) are represented by:

$$I(\text{LEAKAGE}) = AI_s(e^{V/VT} - 1).$$

$$I(\text{SUB}) \, (W/L) e^{(V_{gs}-V_t)/nVT} [1 - e^{-V_{ds}/VT}]$$

where A is area of the diode, W/L is width/length ratio of the transistor, Vgs is bias between the gate and the source of the transistor, and Vt is threshold voltage of the transistor.

Figure 6B:
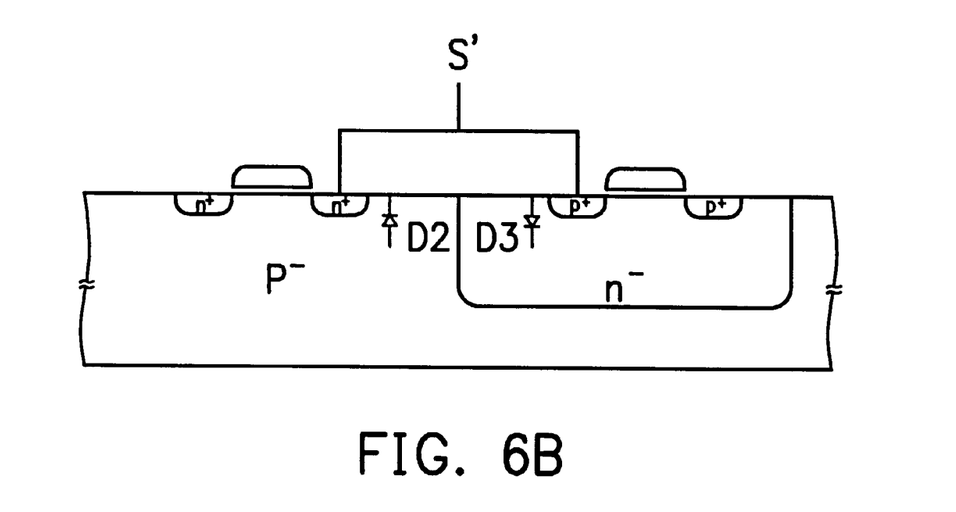
FIG. 6B is sectional diagram showing the memory cell in FIG. 6A formed on a semiconductor substrate.

Therefore, the leakage current ID3+IN6 and the supply current ID2+IP6 can be effectively controlled by changing the process parameters or layouts of the SRAM. When the PMOS transistors P5 and P6 are closed (the word line WL is "1")), a logic "1" signal stored, for example, at the node S', is floating. At this time, two parasitic diodes D2 (at the source/drain junction of the NMOS transistor N6) and D3 (at the source/drain junction of the PMOS transistor P6) are connected to the node S' and respectively provide two reverse bias currents ID2 and ID3, as shown in FIG. 6B. Moreover, although the NMOS transistors N6 and the PMOS transistor P6 are closed, they also provide two subthreshold currents IN6 and IP6 to the node S'. Consequently, the node S' is provided with a leakage current ID3+IN6 which lowers or causes a fall in the voltage level at the node S' and a supply current ID2+IP6 which raises or causes a rise in the voltage level at the node S'. Therefore, as long as the supply current can be controlled to be larger than the leakage current (i.e., ID2+IP6>ID2+IN6), data loss can be avoided in the SRAM.

Further, to ensure a sufficient supply current, an embodiment of the present invention also provides a bit line boosting refresh method, which is described in detail below.

When the PMOS transistors P5 and P6 are closed (the word line WL is "1"), the pair of bit lines BL/BL' are driven to VDD+V, where VDD is a positive source voltage, and V is a voltage difference which is smaller than the threshold voltage of the PMOS transistors |VTP| and is provided to weakly open the PMOS transistors P5 and P6 to provide a small refresh current to the logic "1" signal. As long as the refresh time is long enough, the logic "1" signal can be raised to VDD+V. Moreover, this particular embodiment of the method of the invention refreshes a column of memory cells which are connected to the pair of bit lines BL/BL' at substantially the same time. In contrast to the conventional 4T memory cell, the method according to the invention will not induce a large current at the logic "0" signal to rapidly pull down the bit line voltage (because V<VT). Therefore, the method according to the invention can refresh a column of memory cells at the substantially same time, and will not cause data confusion between different memory cells.

From the above, the method of the invention can refresh a column of memory cells in a single cycle by driving the pair of bit lines BL/BL' to VDD+V without needing to sequentially open the corresponding word lines. Therefore, the method according to the invention is easy to operate and results in lower power dissipation in the SRAM.

In a further embodiment of the invention, in order to reduce loading of the power supply when refreshing many columns of memory cells and to increase noise margin, multiplexers are used so that a column or a predetermined number of columns of memory cells are refreshed in a single cycle. The multiplexers can be controlled by a counter or a shift register.

Figure 7:
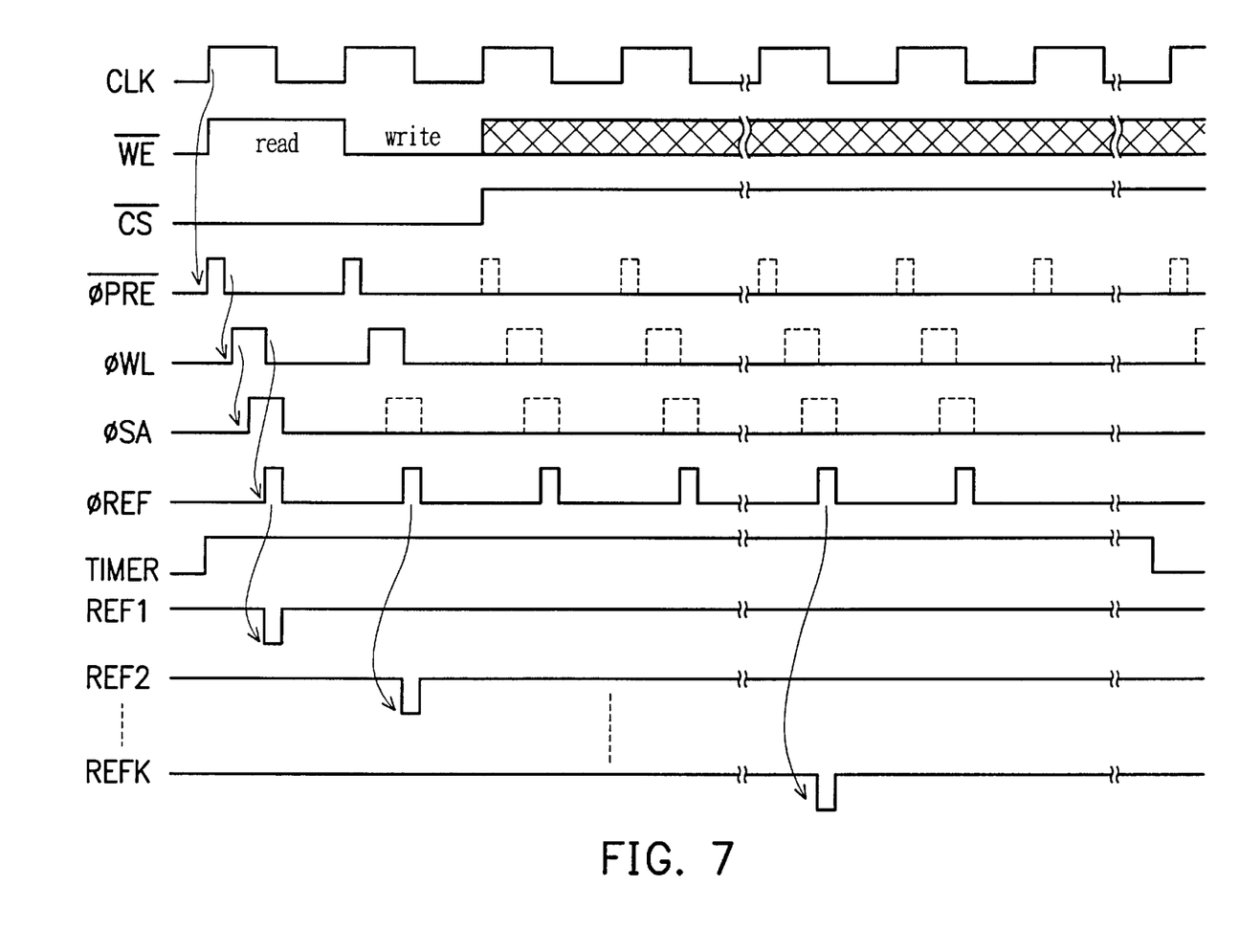
FIG. 7 is a diagram showing an exemplary refresh operation according to the present invention of the memory cell in FIG. 6A.

FIG. 7 is a timing diagram showing a refresh operation of the 2P2N pseudo SRAM of the present invention. In FIG. 7, a TIMER signal is determined by detecting a leakage current to drive a counter to generate an address representing the execution time of the refresh operation. Refresh pulses REF1, REF2, REFk for each column of memory cells are then generated by decoding the addresses which are generated by the counter by an address decoder. The counter is reset after generating a predetermined number of pulses and is triggered again until the next TIMER signal, thereby avoiding the refresh of too many columns of memory cells at substantially the same time.

Embodiments of the refresh method according to the invention in read operation, and write operation are described below in further detail.

[Read Operation]

In read operation, a write enable signal WE' is logic "1" and a chip select signal CS' is logic "0". A precharge enable signal REF is triggered by the rising edges of a system clock CLK and has a pulse width determined by the delay elements. Thereafter, the word line enable signal WL is triggered by the falling edges of the precharge enable signal REF and has a pulse width determined by the delay elements. After the word line WL is open for a short time and a voltage difference (e.g. 0.1~0.3V) appears between the pair of bit lines BL/BL', a sense amplifier enable signal SA becomes logic "1" to amplify the voltage difference, which speeds up the read operation and reduce power consumption is the SRAM. The word line WL is also closed after the sense amplifier SA is enabled to reduce signal swing of the pair of bit lines BL/BL' and to reduce power consumption. Thereafter, the refresh enable signal REF is triggered by the falling edges of the word line enable signal WL and has a pulse width determined by the delay elements. Because the refresh enable signal REF is triggered when the sense amplifier SA is enabled and the word line WL is closed, the refresh method according to the invention will not increase the read time in the SRAM.

[Write Operation]

In write operation, the chip select signal CS' is logic "0" and the write enable signal WE' is logic "0". At this time, the corresponding timing of all signals is almost the same as in read operation except that the sense amplifier enable signal SA is not needed and the write enable signal WE' is used to control the data input. Moreover, when the chip select signal CS' is logic "1" and the write enable signal WE' is arbitrary, no read or write operation is performed. At this time, the hidden refresh is performed only by generating the refresh enable signal REF and the counter address.

Accordingly, the hidden refresh 2P2N pseudo SRAM according to the present invention occupies a smaller chip area than the conventional 6T SRAM. The hidden refresh method according to the present invention is easy to operate and results in lower power dissipation in the SRAM. Further, the hidden refresh operation according to the invention is performed when the sense amplifier is operational, therefore the read time of the SRAM is reduced.

Figure 8:
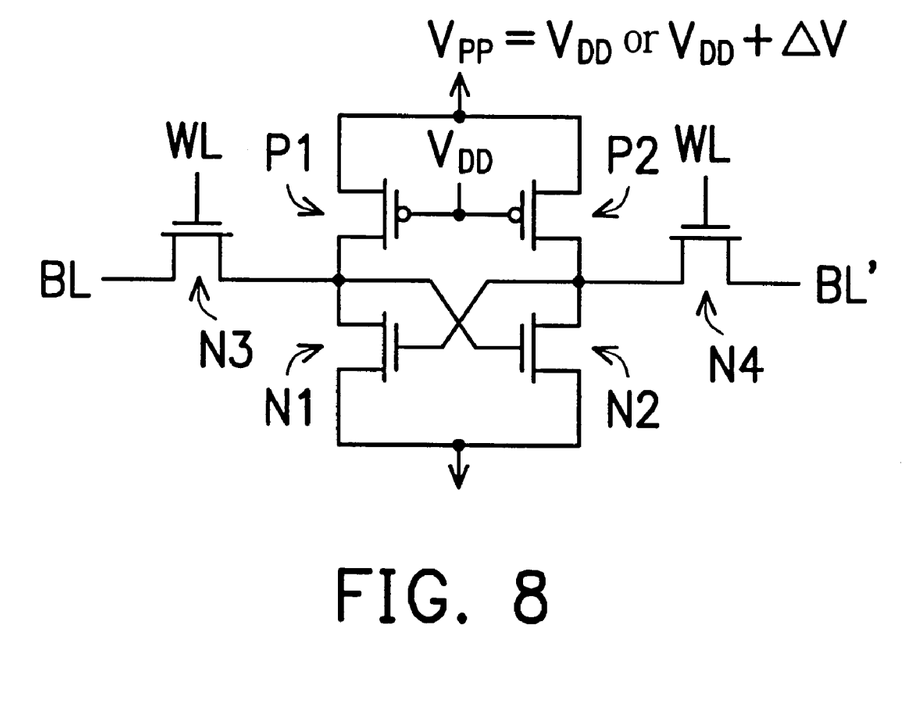
FIG. 8 is a circuit diagram showing a 4T memory cell to which the present invention is applied.

The present invention can also be applied to a 6T memory cell, as shown in FIG. 8. Referring to FIG. 8, the access transistors are NMOS transistors and the PMOS load transistors have their gates connected to a positive source voltage. In normal operation, the PMOS load transistors have their sources connected to the positive source voltage VDD, as in the conventional 4T memory cell. However, in a refresh operation according to the invention, the PMOS load transistors have their sources connected to VDD+ |VTP|.

Figure 9:
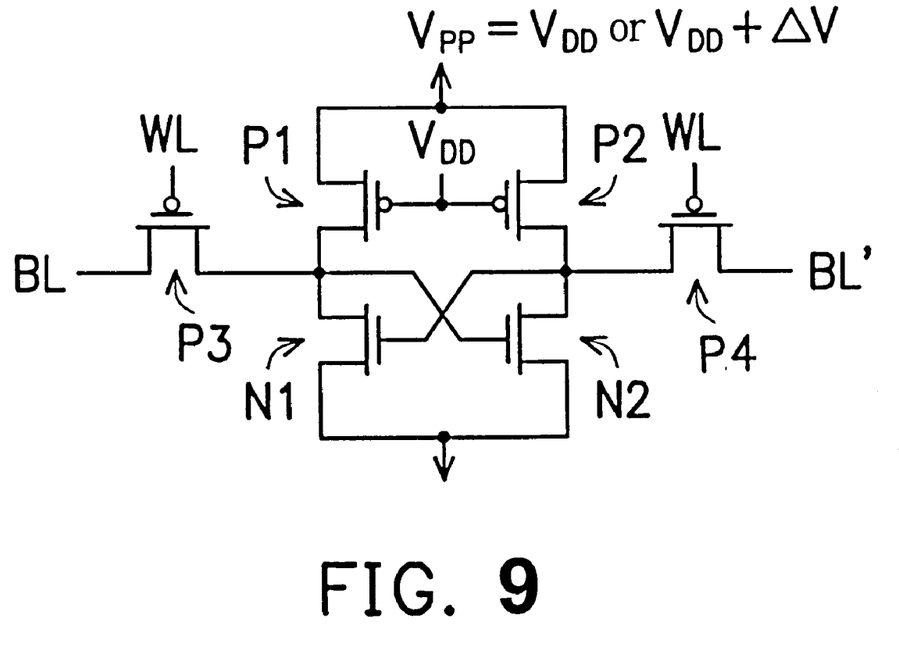
FIG. 9 is another circuit diagram showing a further embodiment of the memory cell to which the present invention is applied.

FIG. 9 is another circuit diagram that illustrates an additional embodiment of the memory cell to which the present invention is applied. The 6T memory cell according to FIG. 9, in contrast to the memory shown in FIG. 8, includes four PMOS transistors (P1, P2, P3 and P4) and two NMOS transistors (N1 and N2), along with the positive source voltage VDD.

The foregoing description of the preferred embodiments of the invention has been presented for purposes of illustration and description. Obvious modification or variation are possible in light of the above teaching. The embodiments are chosen and described to provide the best illustration of the principles of this invention and its practical application to thereby enable those skilled in the art to utilize the invention in various embodiments and with various modifications as are suited to the particular use contemplated. All such modifications and variations are within the scope of the present invention as determined by the appended claims when interpreted in accordance with the breadth to which they are fairly, legally, and equitably entitled.

What is claimed is:

1. A hidden refresh psuedo SRAM having a plurality of memory cells, each of the memory cells comprises:
    a cross-couple latch comprising two NMOS transistors cross coupled to each other;
    two PMOS load transistors having their gates connected to an external positive source voltage, their sources connected to an external operating voltage, and their drains connected to a source of the cross-couple latch; and
    two PMOS access transistors, controlled by a word line, respectively accessing the two NMOS transistors of the cross-couple latch, the two PMOS load transistors, and a pair of bit lines.

2. The hidden refresh pseudo SRAM as claimed in claim 1, wherein the two NMOS transistors of the cross-couple latch are a first NMOS transistor and a second NMOS transistor, the first NMOS transistor comprising a gate, a drain, and a source connected to a negative source voltage, and the second transistor comprising a gate connected to the drain of the first NMOS transistor, a drain connected to the gate of the first NMOS transistor, and a source connected to the negative source voltage.

3. The hidden refresh pseudo SRAM as claimed in claim 2, wherein the two PMOS access transistors are a first PMOS transistor and a second PMOS transistor, the first PMOS transistor comprising a gate connected to the word line, a source connected to one of the pair of bit lines, and a drain connected to the drain of the first NMOS transistor, and the second PMOS transistor comprising a gate connected to the word line, a source connected to another of the pair of bit lines, and a drain connected to the drain of the second NMOS transistor.

4. The SRAM of claim 1 wherein the two NMOS access transistors further comprise gates connected to the word line, sources connected to the bit lines, and drains connected to the cross-couple latch and the two PMOS load transistors.

5. A hidden refresh method for a pseudo SRAM, comprising the steps of:
    providing a pseudo SRAM comprising a plurality of memory cells, each of the memory cells having a cross couple latch which comprises two NMOS transistors cross coupled to each other, two PMOS load transistors having their gates connected to an external positive source voltage, their sources connected to an external operating voltage, and their drains connected to a source of the cross-couple latch; and two PMOS access transistors, which are controlled by a word line, respectively accessing the two NMOS transistors of the cross couple latch, the two PMOS load transistors, and a pair of bit lines; and
    driving the pair of bit lines to a first voltage, which is higher than a positive source voltage of the pseudo SRAM by a voltage difference when the word line is driven to the positive source voltage.

6. The hidden refresh method for a pseudo SRAM as claimed in claim 5, wherein the step of providing the SRAM uses the two PMOS access transistors comprising a first PMOS transistor and a second PMOS transistor, the first PMOS transistor comprising a gate connected to the word line, a source connected to one of the pair of bit lines, and a drain connected to the drain of the first NMOS transistor, and the second PMOS transistor comprising a gate connected to the word line, a source connected to another of the pair of bit lines, and a drain connected to the drain of the second NMOS transistor.

7. The hidden refresh method for a pseudo SRAM as claimed in claim 5, the method being performed when a sensing amplifier connected to the pair of bit lines is operating , so that a read time of the pseudo SRAM is not increased.

8. The hidden refresh method for a pseudo SRAM as claimed in claim 5, wherein the voltage difference is smaller than threshold voltages of the two PMOS access transistors.

9. The hidden refresh method for a pseudo SRAM as claimed in claim 5, wherein a time period is provided in the driving step to ensure that a sufficient current is supplied to the cross couple latch to recover stored data.

10. The method of claim 5, the method being performed in a read operation of the SRAM, further comprising the steps of:

triggering a precharge enable signal by rising and falling edges of a system clock in the SRAM;

opening the word line; and allowing the voltage difference to appear in the pair of bit lines.

11. The method of claim 5, the method being performed in a read operation of the SRAM, further comprising the step of amplifying the voltage difference using a sense amplifier enable signal which speeds up the read operation and reduces power consumption in the SRAM.

12. The method of claim 5, the method being performed in a read operation of the SRAM, further comprising the steps of:

enabling a sense amplifier to amplify the voltage difference;

closing the word line after the sense amplifier is enabled; and reducing signal swing of the pair of bit lines;

wherein power consumption in the SRAM is reduced.

13. The method of claim 5, the method being performed in a read operation of the SRAM, further comprising the step of triggering a refresh enable signal when the voltage difference is amplified and the word line is closed, such that read time in the SRAM is reduced.

14. The method of claim 5, the method being in a write operation of the SRAM, further comprising the steps of:

providing a write enable signal which controls data input into the SRAM; and generating a refresh enable signal.

15. The method of claim 5, wherein the method is used in any one of the group consisting of a 1T1C memory cell, 3T memory cell, 4T memory cell, and a 6T memory cell.

16. The method of claim 5, further comprising the steps of:

detecting a leakage current;

determining a timer signal to drive a counter to generate an address representing an refresh execution time for each of the plurality of memory cells in the SRAM;

decoding the address of each of the memory cells; and generating a refresh pulse corresponding to each of the addresses of the memory cells.

17. The method of claim 16, further comprising the steps of:

resetting the counter after a predetermined number of refresh pulses are generated; and triggering the counter at a next timer signal.

18. The hidden refresh method for a pseudo SRAM as claimed in claim 5, wherein the step of providing the SRAM uses the two NMOS transistors of the cross-couple latch comprising a first NMOS transistor and a second NMOS transistor, the first NMOS transistor comprising a gate, a drain, and a source connected to a negative source voltage, and the second transistor comprising a gate connected to the drain of the first NMOS transistor, a drain connected to the gate of the first NMOS transistor, and a source connected to the negative source voltage.

19. The method of claim 5 further comprising the steps of:

connecting gates of the two NMOS access transistors to the word line;

connecting sources of the two NMOS access transistors to the bit lines; and connecting drains of the two NMOS access transistors to the cross-couple latch and the two PMOS load transistors.

20. The method of claim 5 further comprising the steps of:

connecting gates of the two PMOS load transistors to an external positive source voltage;

connecting sources of the two PMOS load transistors to an external operating voltage; and connecting drains of the two PMOS load transistors to a source of the cross-couple latch.

\* \* \* \* \*